United States Patent
Chacon et al.

(10) Patent No.: US 6,664,800 B2
(45) Date of Patent: Dec. 16, 2003

(54) NON-CONTACT METHOD FOR DETERMINING QUALITY OF SEMICONDUCTOR DIELECTRICS

(75) Inventors: Carlos M. Chacon, Orlando, FL (US); Sundar Chetlur, Singapore (SG); Pradip K. Roy, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 47 days.

(21) Appl. No.: 09/756,965

(22) Filed: Jan. 8, 2001

(65) Prior Publication Data

US 2002/0121914 A1 Sep. 5, 2002

(51) Int. Cl.[7] .............................................. G01R 31/00
(52) U.S. Cl. ...................................... 324/765; 324/750
(58) Field of Search ................................ 324/750, 751, 324/752, 501, 765, 537; 250/492.2; 438/14, 17, 18

(56) References Cited

U.S. PATENT DOCUMENTS

| | | | |
|---|---|---|---|
| 4,812,756 A | * 3/1989 | Curtis et al. | 250/492.2 |
| 5,219,774 A | 6/1993 | Vasche | |
| 5,254,482 A | 10/1993 | Fisch | |
| 5,444,637 A | 8/1995 | Smesny et al. | |
| 5,462,898 A | 10/1995 | Chen et al. | |
| 5,498,974 A | * 3/1996 | Verkuil et al. | 250/492.2 |
| 5,519,334 A | 5/1996 | Dawson | |
| 5,851,892 A | 12/1998 | Lojek et al. | |
| 6,011,404 A | 1/2000 | Ma et al. | |
| 6,037,797 A | 3/2000 | Lagowski et al. | |
| 6,207,468 B1 | * 3/2001 | Chacon et al. | 324/752 |

OTHER PUBLICATIONS

"Gate Oxide Damage from Plasma Processing"; Silicon Processing for the VLSI ERA; vol. III; pp. 504–514. (No Date).

P. K. Roy, C. Chacon, Y. Ma, I.C. Kizilyalli, G.S. Horner, R. L. Verkuil, T.G. Miller; "Non–Contact Characterization of Ultra Thin Dielectrics for the Gigabit Era"; Electrochemical Society Proceedings—vol. 97–12; pp. 280–289. (No Date).

P. K. Roy, C. Chacon, Y. Ma and G.S. Horner; "In–Line Charge– Trapping Characterization of Dielectrics for Sub–0.5 μm CMOS Technologies"; Oct. 1–2, 1997; SPIE vol. 3215; pp. 70–83.

* cited by examiner

Primary Examiner—Vinh P. Nguyen

(57) ABSTRACT

A non-contact method for determining a quality of a semiconductor dielectric. The method includes depositing a charge on a dielectric to achieve a high voltage on the dielectric, measuring a voltage drop of the dielectric as a function of time, and determining a soft breakdown voltage of the dielectric from the voltage drop as a function of time. The amount of charge that is deposited may vary. For example, the charge may be deposited until a voltage that ranges from about 4 megavolts to about 16 megavolts is achieved on the dielectric. The amount of charge may also depend on the thickness of the dielectric. For example, applying a charge as a function of the thickness may include applying 4 megavolts when the thickness is about 1.2 nm or applying 16 megavolts when the thickness is about 5.0 nm.

12 Claims, 2 Drawing Sheets

NON-CONTACT METHOD FOR DETERMINING QUALITY OF SEMICONDUCTOR DIELECTRICS

TECHNICAL FIELD OF THE INVENTION

The present invention is directed, in general, to a non-contact method for determining the quality of a dielectric and, more specifically, to a non-contact method for determining soft breakdown in a dielectric.

BACKGROUND OF THE INVENTION

The use of different methods for manufacturing semiconductors has reached phenomenal proportions over the last decade. Equally phenomenal has been the ever-decreasing device size of the semiconductors themselves, including the thickness of dielectrics such as gate oxides, within metal-oxide semiconductor field effect transistors (MOSFETs). It is particularly desirable to make the thickness of the gate oxide in these devices as small as possible since the drive current in semiconductor devices increases as the thickness of the gate oxide decreases. Unfortunately, along with the trend towards thinner gate oxides comes the increased risk of reduced quality of the dielectric gate oxide layers. Moreover, at present day ultra-thin thicknesses, it is imperative that the gate oxide be of the highest quality possible.

To assist in determining the quality of gate oxides, as well as other dielectrics, several techniques have been developed. Among these techniques are "contact" and "non-contact" techniques, both of which may be used to measure a variety of charge-trapping parameters of dielectrics, such as charge contamination ($Q_m$), the degree of density of interface traps ($D_{it}$), the flatband voltage ($V_{fb}$) and the level of mobile charge carrier, to determine the quality of the dielectric. Those skilled in the art are familiar with such contact techniques, such as capacitance-voltage testing (C-V testing) and the difficulties, time and costs associated with such techniques.

Recently, non-contact techniques have been developed to overcome the numerous deficiencies of contact techniques. One such non-contact technique is the corona-oxide-semiconductor testing (COS testing) process that allows the quality of a dielectric to be determined without physically contacting the semiconductor wafer in the process. Advantages associated with non-contact techniques include the fact that they are less invasive, as well as quicker, in determining gate oxide quality. In addition, some non-contact techniques, such as COS testing, allow gate oxide quality to be determined "in-line", during the manufacturing process, rather than after manufacturing of the complete semiconductor device has been completed. Unfortunately, although COS testing is one of the common non-contact techniques currently used for determining gate oxide quality, it remains dependent on the use of the charge-trapping parameters discussed above.

While the commonly used charge-trapping parameters of dielectrics ($Q_m$, $D_{it}$, $V_{fb}$) are helpful in determining gate oxide quality, they may not be the best indicators of the gate oxide's quality. Thus, in light of this limitation, accuracy provided by the charge-trapping parameters, techniques for determining dielectric layer quality that rely on these parameters are likewise limited in accuracy when determining the quality of dielectrics.

Accordingly, what is needed in the art is an improved non-contact technique for determining the quality of dielectrics, such as gate oxides, in a semiconductor device that does not suffer from the deficiencies of the techniques found in the prior art.

SUMMARY OF THE INVENTION

To address the above-discussed deficiencies of the prior art, the present invention provides a non-contact method for determining a quality of a semiconductor dielectric. In one advantageous embodiment, the method includes depositing a charge on a dielectric to achieve a high voltage on the dielectric, measuring a voltage drop of the dielectric as a function of time, and determining soft breakdown of the dielectric from the voltage drop as a function of time. The amount of charge that is deposited may vary. For example, in one embodiment, the charge may be deposited until a voltage that ranges from about 4 megavolts to about 16 megavolts is achieved on the dielectric. The amount of charge may also depend on the thickness of the dielectric. For example, applying a charge as a function of the thickness may include applying 4 megavolts when the thickness is about 1.2 nm or applying 16 megavolts when the thickness is about 5.0 nm.

The method may also include determining a stress-induced leakage current within the dielectric from the voltage drop as a function of time. The stress-induced leakage current can be determined from the same data from which the soft breakdown is determined. Typically, however, the stress-induced leakage current will be determined over a longer period of time than that used to determine the soft breakdown.

Because of the ease with which the soft breakdown can now be determined, the present invention is particularly well suited for determining the soft breakdown of a gate oxide during an in-line process of fabricating a semiconductor device.

The foregoing has outlined, rather broadly, preferred and alternative features of the present invention so that those who are skilled in the art may better understand the detailed description of the invention that follows. Additional features of the invention will be described hereinafter that form the subject of the claims of the invention. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
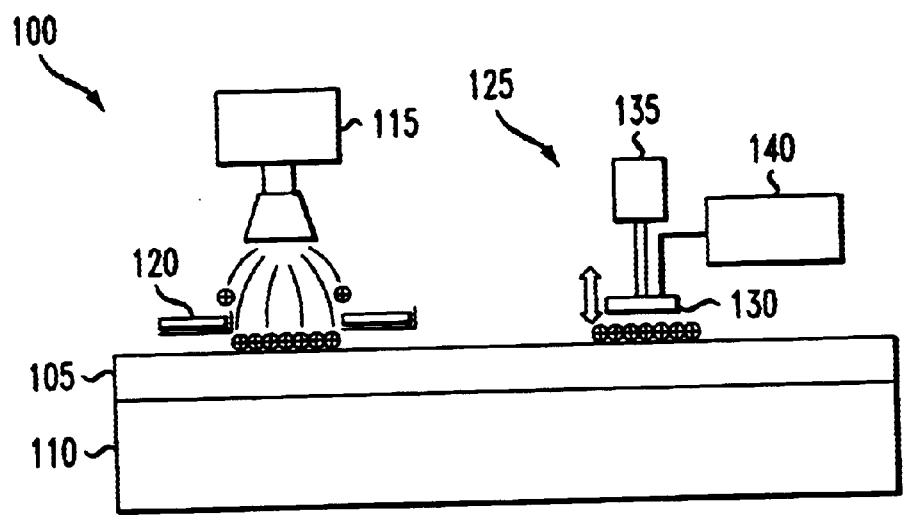
FIG. 1 illustrates a system providing an environment for determining the quality of a dielectric according to the principles of the non-contact method of the present invention.

Referring initially to FIG. 1, illustrated is a system 100 providing an environment for determining the quality of a dielectric according to the principles of the non-contact method of the present invention. The system 100 includes a semiconductor wafer 110 and a layer of semiconductor dielectric 105 deposited thereon.

The dielectric 105 may be formed using known techniques, such as by growing the dielectric or by chemical vapor deposition (CVD). In a particularly advantageous embodiment, the dielectric 105 is a gate oxide for use with a metal-oxide semiconductor field effect transistor (MOSFET) in an integrated circuit. Although determining the quality of the gate oxide of a MOSFET is highly desirable, the non-contact method of the present invention may be used to detect the quality of other dielectrics as well.

In an advantageous embodiment of the present invention, the dielectric 105 is deposited to a thickness ranging from about 1.2 nm to about 5.0 nm. In a related embodiment, the dielectric 105 is deposited on the wafer 110 to a thickness of about 3.0 nm. Those skilled in the art will understand that such thicknesses are merely examples, and that the present invention is not limited to any particular thickness of dielectric 105. However, the present invention is particularly applicable in determining the quality of an ultra-thin oxide having a thickness of about 5.0 nm or less.

The system 100 further includes a charge source 115 for depositing a charge on the dielectric 105, as well as a guard ring 120 to serve as an isolation mask for the charge deposition. In an exemplary embodiment, the charge source 115 is a conventional corona source, which is used to deposit a charge on the dielectric 105.

The system 100 in FIG. 1 also includes a measuring device 125. In the illustrated embodiment, the measuring device 125 is a Kelvin probe 125. The Kelvin probe 125 includes a reading head 130 and a mechanical oscillator 135. In addition, the Kelvin probe 125 may be coupled to a conventional computer system 140 for use in compiling the data retrieved by the reading head 130. Those skilled in the art understand the structure and use of Kelvin probes 125, as well as the advantages associated with their use in gathering data. Of course, the present invention is not limited to using a Kelvin probe, and may incorporate any measuring device configured to retrieve the data necessary to determine the quality of the dielectric 105 in accordance with the principles of the present invention.

It has been recently discovered that one of the better indicators of dielectric quality is the dielectric's soft breakdown point. Thus, in the present invention, the quality of the dielectric 105 is determined by using the non-contact method to obtain the soft breakdown point of the dielectric 105. Additionally, because of its non-invasive nature, the process provided by the present invention can be used during the manufacturing process. Moreover, because of the direct relationship with the conducting quality, it has been discovered that determining the soft breakdown of a dielectric paints a more accurate picture of dielectric quality than reliance on the charge-trapping parameters mentioned above.

The hard breakdown point of a semiconductor dielectric, which is well known in the industry, is the point at which the dielectric material physically ruptures in response to excessive electrical current that induces stress on the dielectric. In response to this stress, physical imperfections within in the dielectric, such as micropores or fissures, expand to the point of extending entirely through the dielectric material, thus resulting in the rupture. Of course, once a dielectric, such as a gate oxide, has reached the hard breakdown point it is permanently damaged and unrecoverable. As a result, the device becomes inoperable.

On the other hand, the soft breakdown point is the point at which these physical imperfections have not been stressed to the point of total failure, but have had enough stress induced such that any physical imperfections are manifested by leaking current. For example, as the gate oxide of a device approaches the soft breakdown point, an increasing amount of leakage current passes through the dielectric material through fissures or other defects resulting from the deposition of the gate oxide. As the thickness of the dielectric decreases, the minute defects may become more prominent and may result in a lower soft breakdown point. Although a gate oxide at the soft breakdown point is still operable, it will become permanently inoperable if stressed to the hard breakdown point.

To determine the quality of the dielectric 105 using the non-contact method of the present invention, the system 100 functions as follows. The charge source 115 deposits a substantially instantaneous charge on the dielectric 105 sufficient to achieve a high voltage build up on the surface of the dielectric 105. For purposes of the present invention, the phrase "high voltage" is defined as a voltage well above the soft breakdown point of a dielectric material and examples of which are mentioned below. As the charge source 115 deposits the charge, the guard ring 120 serves as an isolation mask to isolate a target area of the dielectric 105 for testing. It should be noted that the high voltage formed by the method covered by the present invention is significantly higher than voltages typically used in conventional non-contact method techniques.

In an exemplary embodiment, the charge by the charge source 115 achieves a high voltage in the dielectric 105 that may range from about 4 megavolts to about 16 megavolts. In a more specific embodiment of the present invention, the charge source 115 deposits a charge in the dielectric 105 sufficient to achieve a high voltage of about 8 megavolts. Preferably, the amount of high voltage achieved by depositing a charge in the dielectric 105 varies as a function of the thickness of the dielectric 105. For example, in such embodiments, a charge is deposited by the charge source 115 sufficient to achieve a high voltage of about 4 megavolts when the thickness of the dielectric 105 is about 1.2 nm. Similarly, if the thickness of the dielectric 105 is about 5.0 nm, a charge is deposited by the charge source 115 sufficient to achieve a high voltage of about 16 megavolts.

Figure 2:
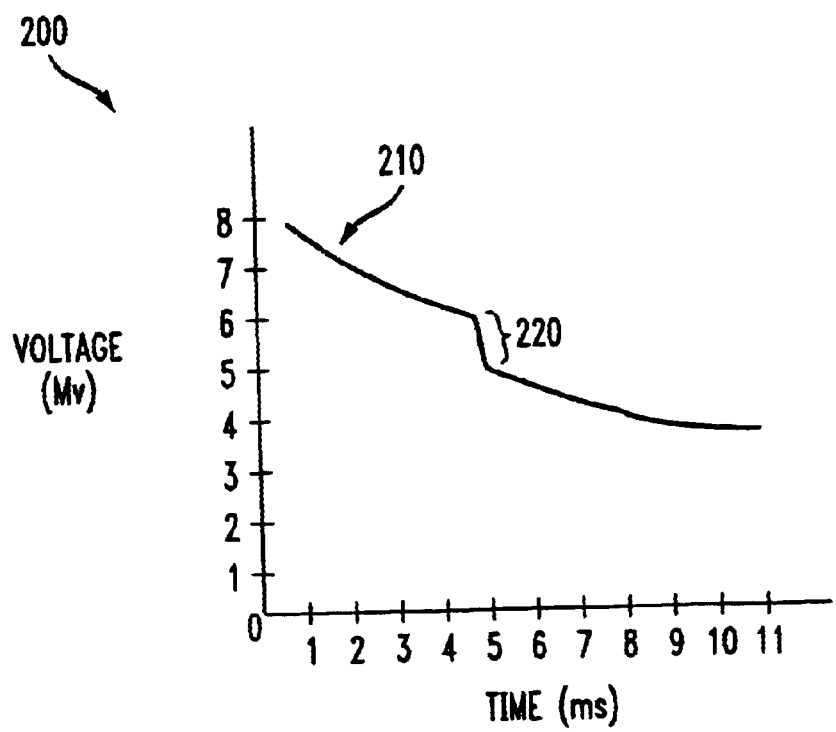
FIG. 2 illustrates a line graph illustrating voltage drop as a function of time for use in determining the quality of a dielectric according to the non-contact method of the present invention.

Turning now to FIG. 2, with continued reference to FIG. 1, illustrated is a line graph 200 illustrating voltage drop as a function of time for use in determining the quality of a dielectric according to the non-contact method of the present invention. In accordance with the exemplary embodiment described above, the line graph 200 illustrates a voltage drop line 210 illustrating a drop from an initial high voltage of about 8 megavolts over a time period of about 11 ms.

As illustrated by the line graph 200, once deposited, the high voltage is allowed to decay, or drop, over a period of time. While the high voltage decays, the Kelvin probe 125 measures the voltage drop of the dielectric 105 as a function of the time period. In an advantageous embodiment, the voltage drop of the dielectric 105 is measured every 1 ms by the Kelvin probe 125. In accordance with non-contact testing techniques, the Kelvin probe 125 does not contact the dielectric 105, or any other part of the wafer 110, while measuring the voltage drop.

As illustrated in the line graph 200, throughout the first four milliseconds, a substantially constant drop is measured by the Kelvin probe 125 and illustrated by the voltage drop line 210. However, at about 5 ms, the decaying voltage evidences a relatively steep voltage drop 220 for a brief moment, which is detected by the Kelvin probe 125. As seen from FIG. 2, the steep voltage drop 220 occurs over a relatively short period of time, and faster than the substantially constant decaying measured prior to the steep voltage drop 220. In the present invention, this steep voltage drop 220 indicates the soft breakdown point of the dielectric 105. It has also been discovered that the soft breakdown point is a superior indicator of oxide quality. Then, as illustrated, after the steep voltage drop 220, the voltage resumes decaying at the previous substantially constant rate. The steep voltage drop 220 is used to determine the soft breakdown point of the dielectric. For example, in an exemplary embodiment, the soft breakdown point of the dielectric 105 occurs when the voltage drop line 210 evidences a change in voltage that is approximately 5% of the total voltage drop.

The voltage drop line 210 in FIG. 2 also allows another important measurement to be determined. Specifically, once the Kelvin probe 125 has measured the rate of voltage decay across the dielectric 105, Ohm's Law may be used to determine the stress-induced leakage current (SILC) of the dielectric 105. Since the resistance (R) of the dielectric 105 remains unchanged throughout the testing process, the change in current ($\Delta I$) is directly proportional to the change in voltage ($\Delta V$), as illustrated by the following formula:

$$\Delta V = \Delta I \times R \text{ or } \Delta I = \frac{\Delta V}{R}$$

As a result, the decaying voltage illustrated by the voltage drop line 210 in FIG. 2 may be used with the formula above to calculate the SILC of the dielectric 105. By calculating the SILC, semiconductor manufacturers may use this information to further improve the manufacturing process.

Since the present invention can be used to easily determine the soft breakdown point of a dielectric, and thus its quality, the present invention overcomes deficiencies associated with techniques found in the prior art. More specifically, simply using the soft breakdown of a dielectric as the gauge for quality results in greater accuracy in the determination of quality than reliance on the charge-trapping parameters discussed above. In addition, the non-contact method of the present invention allows for in-line testing of semiconductor dielectrics, rather than having to wait until the manufacturing process on a semiconductor device is complete. With in-line testing, a single dielectric, such as a gate oxide of a MOSFET, may be tested and those results used to adjust deposition parameters to improve the quality of the dielectrics to be deposited. Those skilled in the art understand the substantial costs that may be saved by performing such in-line testing during the manufacturing process. Furthermore, the non-contact method of the present invention may also be used to determine the stress-induced leakage current of dielectrics. Those skilled in the art understand the advantages of knowing the SILC of semiconductor dielectrics, as well as how that information may be used to further improve the manufacturing process.

Figure 3:
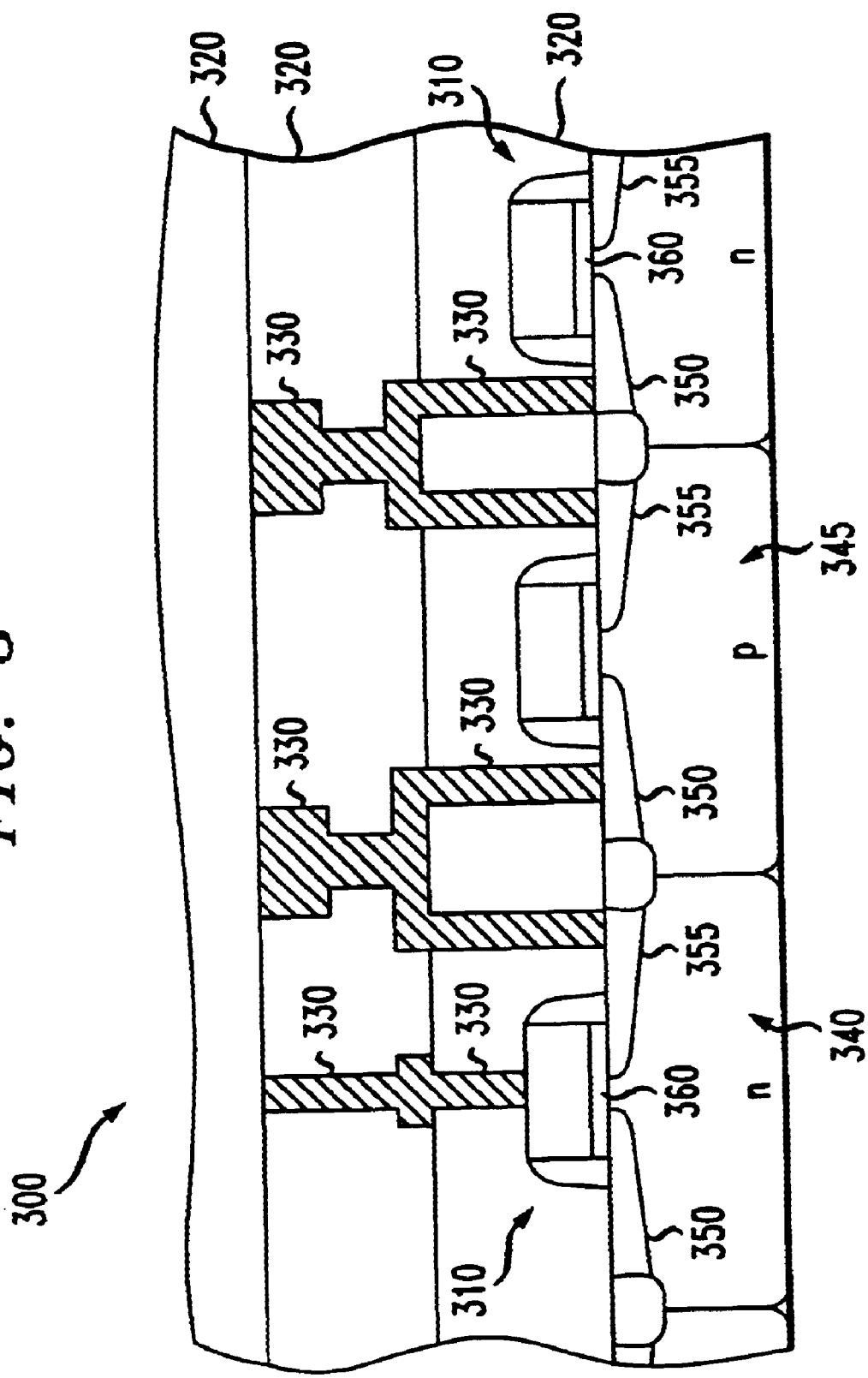
FIG. 3 illustrates a sectional view of a conventional, operative integrated circuit that may be manufactured according to the principles of the present invention.

Turning finally to FIG. 3, illustrated is a sectional view of a conventional, operative integrated circuit (IC) 300 that may be manufactured according to the principles of the present invention. The integrated circuit 300 may include a CMOS device, a BiCMOS device, a Bipolar device, or other type of IC device. Those skilled in the art are familiar with the various types and manufacture of these devices which may be located in the IC 300. As illustrated in FIG. 3, components of the conventional IC 300 include transistors 310, gate oxide layers 360, and other dielectric layers 320, in which interconnect structures 330 are formed (together forming interconnect layers). In the embodiment shown in FIG. 3, the interconnect structures 330 connect the transistors 310, which may be MOSFETs, to other areas or components of the IC 300. Also shown in FIG. 3 are conventionally formed tubs 340, 345, source regions 350, and drain regions 355.

By incorporating the described non-contact method of detecting soft breakdown during the manufacture of the gate oxide layers 360, semiconductor manufacturers may insure that the oxidation parameters used to grow the gate oxide layers 360 meet certain desired quality parameters. In an exemplary embodiment, parameters indicating a good quality gate oxide include: a density of interface traps ($D_{it}$) less than $5.00 \cdot 10^{10}$ $(cm^2\text{-}eV)^{-1}$, a tunneling field ($E_{tun}$) greater than 6 mV/cm, a charge-to breakdown ($Q_{bd}$) greater than 1 col/cm$^2$, a leakage of less than 0.1 per cm$^2$, and a fixed oxide charge ($Q_f$) less than $5.00 \cdot 10^{10}$ q/cm$^2$. Of course, the present invention is broad enough to encompass other gate oxide parameters. If the soft breakdown of the gate oxide layers 360 is outside the desired parameters, the oxidation parameters may be modified so that the quality of the gate oxide layers 360 comply with the desired parameters. Since the present invention embodies an in-line testing method, significant costs may be saved by determining the quality of the gate oxide layers 360 as they are manufactured, before an entire lot of semiconductor devices having substandard gate oxides is completed.

After the oxidation parameters are modified such that the soft breakdown, and thus the quality, of the gate oxide layers 360 falls within the desired parameters, transistor gates for the transistors 310 are formed over the gate oxide layers 360. The transistors 310 are then connected to each other, as well as to other devices, with the interconnect structures 330 to form the operative integrated circuit 300.

Of course, use of the non-contact method of the present invention is not limited to the manufacture of the particular IC 300 illustrated in FIG. 3. In fact, the present invention is broad enough to encompass the manufacture of any type of integrated circuit derived from a semiconductor wafer which would benefit from quality testing of the dielectrics therein during the manufacturing process.

Although the present invention has been described in detail, referring to several embodiments, those skilled in the art should understand that they can make various changes, substitutions and alterations herein without departing from the spirit and scope of the invention in its broadest form.

What is claimed is:

1. A non-contact method for determining a quality of a semiconductor dielectric, comprising:
   depositing a charge on a dielectric to achieve a high voltage on the dielectric;
   measuring a voltage drop of the dielectric as a function of time; and
   determining a soft breakdown voltage of the dielectric from the voltage drop as a function of time.

2. The method as recited in claim 1 further including determining a stress-induced leakage current within the dielectric from the voltage drop as a function of time.

3. The method as recited in claim 1 wherein depositing a charge includes depositing a charge with a corona source.

4. The method as recited in claim 1 wherein depositing a charge includes depositing a charge to achieve a high voltage that ranges from about 4 megavolts to about 16 megavolts.

5. The method as recited in claim 4 wherein depositing a charge includes depositing a charge to achieve a high voltage of about 8 megavolts.

6. The method as recited in claim 1 wherein the dielectric has a thickness ranging from about 1.2 nm to about 5.0 nm.

7. The method as recited in claim 6 wherein depositing a dielectric includes depositing a dielectric having a thickness of about 3.0 nm.

8. The method as recited in claim 1 wherein said measuring is performed with a Kelvin probe.

9. The method as recited in claim 1 wherein depositing a charge includes depositing a charge as a function of a thickness of the dielectric.

10. The method as recited in claim 9 wherein depositing a charge as a function of the thickness includes depositing 4 megavolts when the thickness is about 1.2 nm or depositing 16 megavolts when the thickness is about 5.0 nm.

11. The method as recited in claim 1 wherein the dielectric is a gate oxide and said determining the soft breakdown voltage includes determining the soft breakdown voltage during an in-line process of fabricating the semiconductor device.

12. The method as recited in claim 1 wherein said measuring a voltage drop includes measuring the voltage on the dielectric once every 1 ms.

\* \* \* \* \*